United States Patent
Desplats et al.

(10) Patent No.: US 8,555,728 B2
(45) Date of Patent: Oct. 15, 2013

(54) METHOD AND INSTALLATION FOR EXPOSING THE SURFACE OF AN INTEGRATED CIRCUIT

(75) Inventors: Romain Desplats, Castanet Tolosan (FR); Michaël Obein, Caen (FR)

(73) Assignee: Centre National d'Etudes Spatiales, Paris (FR)

( * ) Notice: Subject to any disclaimer, the term of this patent is extended or adjusted under 35 U.S.C. 154(b) by 695 days.

(21) Appl. No.: 12/521,444

(22) PCT Filed: Dec. 12, 2007

(86) PCT No.: PCT/FR2007/002056
§ 371 (c)(1),
(2), (4) Date: Dec. 24, 2009

(87) PCT Pub. No.: WO2008/090281
PCT Pub. Date: Jul. 31, 2008

(65) Prior Publication Data
US 2010/0154558 A1    Jun. 24, 2010

(30) Foreign Application Priority Data
Dec. 28, 2006    (FR) ...................................... 06 11489

(51) Int. Cl.
*G01N 3/24*    (2006.01)
(52) U.S. Cl.
USPC .......................................................... 73/842
(58) Field of Classification Search
USPC ............................................. 73/842; 156/628
See application file for complete search history.

(56) References Cited

U.S. PATENT DOCUMENTS

| | | | |
|---|---|---|---|
| 4,611,919 A * | 9/1986 | Brooks et al. ................. | 356/504 |
| 4,689,467 A * | 8/1987 | Inoue .......................... | 219/121.6 |
| 4,714,516 A * | 12/1987 | Eichelberger et al. .......... | 216/62 |
| 6,699,780 B1 | 3/2004 | Chiang | |
| 7,000,313 B2 * | 2/2006 | McCollum et al. ............. | 29/852 |
| 2002/0181538 A1 * | 12/2002 | Clyne .......................... | 374/100 |
| 2004/0150096 A1 | 8/2004 | Purushothaman | |
| 2005/0221586 A1 | 10/2005 | Mulligan | |
| 2006/0233969 A1 * | 10/2006 | White et al. .................. | 427/576 |
| 2010/0136870 A1 * | 6/2010 | Suzuki et al. .................. | 445/24 |

FOREIGN PATENT DOCUMENTS

JP    2001049014    2/2001

OTHER PUBLICATIONS

Butler et al. : "Multichip module packaging of microelectromechanical systems", Sensors and Actuators A, vol. 70, No. 1-2, Oct. 1, 1998, pp. 15-22 , XP002443624 pp. 16-11, paragraph 3.
International Search Report dated Jul. 4, 2008, in PCT application.

* cited by examiner

*Primary Examiner* — Lisa Caputo
*Assistant Examiner* — Jamel Williams
(74) *Attorney, Agent, or Firm* — Young & Thompson (57) ABSTRACT

The invention relates to a method for exposing an integrated circuit by ablating the polymer coating initially covering the integrated circuit, characterized in that it includes the combined application of a laser radiation and a plasma onto the coating initially covering the integrated circuit.

16 Claims, 3 Drawing Sheets

METHOD AND INSTALLATION FOR EXPOSING THE SURFACE OF AN INTEGRATED CIRCUIT

BACKGROUND OF THE INVENTION

1. Field of Invention

The present invention relates to a method for exposing an integrated circuit by ablation of a polymer coating which initially covers the integrated circuit.

2. Description of Related Art

Integrated circuits are etched in a block of silicon which is provided with lateral connections which are constructed particularly from copper and allow the connection of the internal circuit to a printed circuit carrying other electronic components.

The integrated circuit is encapsulated in a polymer coating which rigidly maintains the connection lugs, with the manipulation of the circuit being allowed and its protection being ensured.

In order to analyse the operation of the integrated circuits, it is necessary in some cases to be able to access the integrated circuit whilst retaining its integrity and its operational capacities.

To that end, it is known to locally carry out ablation of the polymer coating, allowing a surface of the integrated circuit to be exposed.

In order to ablate the polymer coating, it is known to apply a high-power laser beam to the polymer coating and to sweep the integrated circuit in order to bring about degradation of the coating.

This method is carried out in a specific installation allowing the application of the laser to be precisely controlled.

An excessively large application using the laser beam results in an attack on the silicon and damage to the circuit.

In order to avoid such damage, the laser is applied in a moderate manner, but islets of polymer remain in position on the circuit, which impairs subsequent observation of the integrated circuit.

It is further known to use a plasma in order to attack the polymer coating in the region of the integrated circuit. This attack is carried out in a suitable sealed vessel, in which the circuit is arranged. This vessel allows a plasma to be produced above the circuit.

The plasma brings about an attack on the polymer coating. However, the action of the plasma is very slow and allows only a very small thickness of the plastics coating to be removed.

Document U.S. Pat. No. 4,689,467 describes a device for cutting a production component which is constructed from a single material. The device comprises a laser and a plasma gun.

However, this laser has too high a power level to be able to be used in microelectronics.

The plasma gun is further above all an auxiliary energy generator which heats the production component in order to cut it more rapidly. This gun cannot be used to expose an integrated circuit because it would have the effect of melting the polymer coating, the connection conductors and the components of the circuit. Therefore, such a plasma gun would damage the printed circuit which is not yet integrated.

As indicated in line 40, column 11 of this document, a corona discharge, that is to say, an electric arc, is generated in order to produce the plasma. Such an electric arc would destroy the integrated circuit if it were used to expose an integrated circuit. The stream discharged from the plasma gun has a micro-abrasion effect at the atomic level.

Consequently, the cutting device described in this document cannot be used to expose an integrated circuit.

The document entitled "Multichip module packaging of Microelectromechanical systems" describes a method for exposing a microplate of an electromechanical microsystem (MEMS). According to this method, two layers of dielectric material covering the microplate are removed by ablation during the application, firstly, of a laser beam and subsequently a plasma attack.

However, this document makes no mention of the microplate being held on the same support and in the same vessel during the application of the laser and the application of the plasma. When the microplate is moved after the laser is applied, it is no longer possible to carry out the plasma attack, exactly at the location selected, taking into consideration the size of the portions of the integrated circuit to be processed.

Taking into consideration the low ablation capacity of the plasma, it is known to prepare the test-piece by mechanically or chemically reducing the thickness of the polymer coating provided above the integrated circuit.

To that end, in accordance with a first embodiment, flat polishing of the coating of the integrated circuit is carried out using a grinding wheel, thereby allowing only a small thickness of the coating, which is subsequently removed by the action of the plasma, to be left.

According to another embodiment, the majority of the thickness of the coating is removed by chemical attack using an acid and in particular a nitric or sulphuric acid.

The action of the acid is complex to stop and may cause damage to the circuit or the electrical connections to the casing.

Those two implementation methods thus provide for preparation of the test-piece outside the vessel for application of the plasma, then a subsequent step for processing the test-piece with the plasma in order to remove the final thickness of polymer whilst the test-piece has been placed in the vessel, in which the plasma is produced.

Such methods take a relatively long time to carry out because they require the use of two different ablation techniques.

SUMMARY OF THE INVENTION

An object of the invention is to provide a method for exposing the surface of an integrated circuit which may be rapidly carried out whilst allowing a satisfactory surface state of the integrated circuit to be obtained.

To that end, the invention relates to a method for exposing an integrated circuit by ablation of a polymer coating which initially covers the integrated circuit, characterised in that it comprises a combined application of laser radiation and a plasma to the coating which initially covers the integrated circuit, the combined application being carried out in the same vessel.

Specific embodiments are described in the dependent claims.

The invention also relates to a shear test method for the connection conductors of an integrated circuit which is initially covered by a polymer coating comprising:

an initial step of exposing the integrated circuit and the connection conductors by a method as described above and a shear test step for the conductors which are exposed in this manner.

Finally, the invention relates to an installation for exposing an integrated circuit by ablation of a polymer coating which initially covers the integrated circuit comprising:

means for applying laser radiation to the surface of the integrated circuit;

means for applying, combined with the application of laser radiation, an attack by plasma to the coating which initially covers the integrated circuit; and a plate for supporting the integrated circuit during the processing thereof, and the application means for the laser radiation and the application means for the plasma are capable of acting on the same support plate.

BRIEF DESCRIPTION OF THE DRAWING FIGURES

The invention will be better understood from a reading of the following description which is given purely by way of example with reference to the drawings, in which.

DETAILED DESCRIPTION OF THE INVENTION

Figure 1:
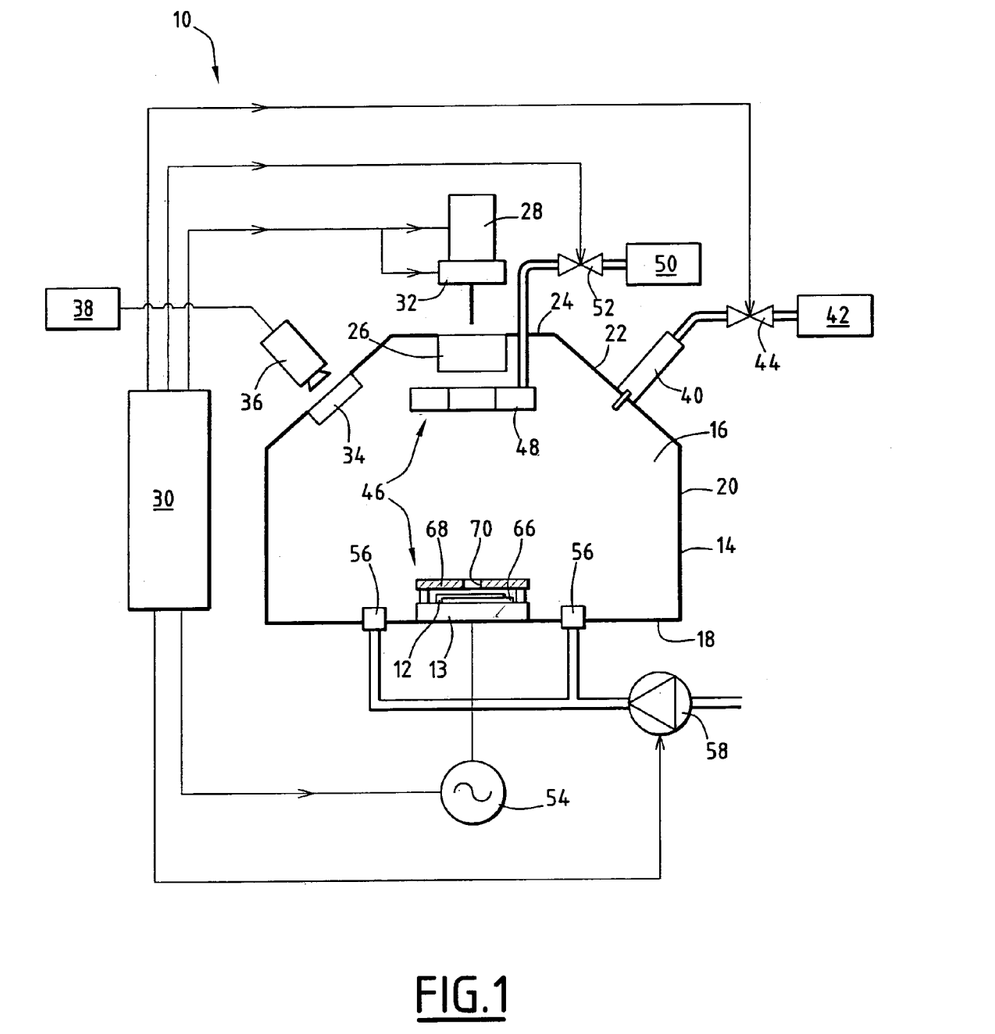
FIG. 1 is a schematic view of a first embodiment of an installation for exposing an integrated circuit according to the invention.

The installation 10 illustrated in FIG. 1 is capable of ensuring the exposure of a test-piece 12 formed by an integrated circuit contained in a polymer coating by successively using a laser beam and a plasma under reduced pressure. The circuit 12 is carried by a plate 13.

This installation comprises a vacuum chamber 14 which delimits a sealed vessel 16. The chamber 14 is illustrated in greater detail in FIG. 2.

Figure 2:
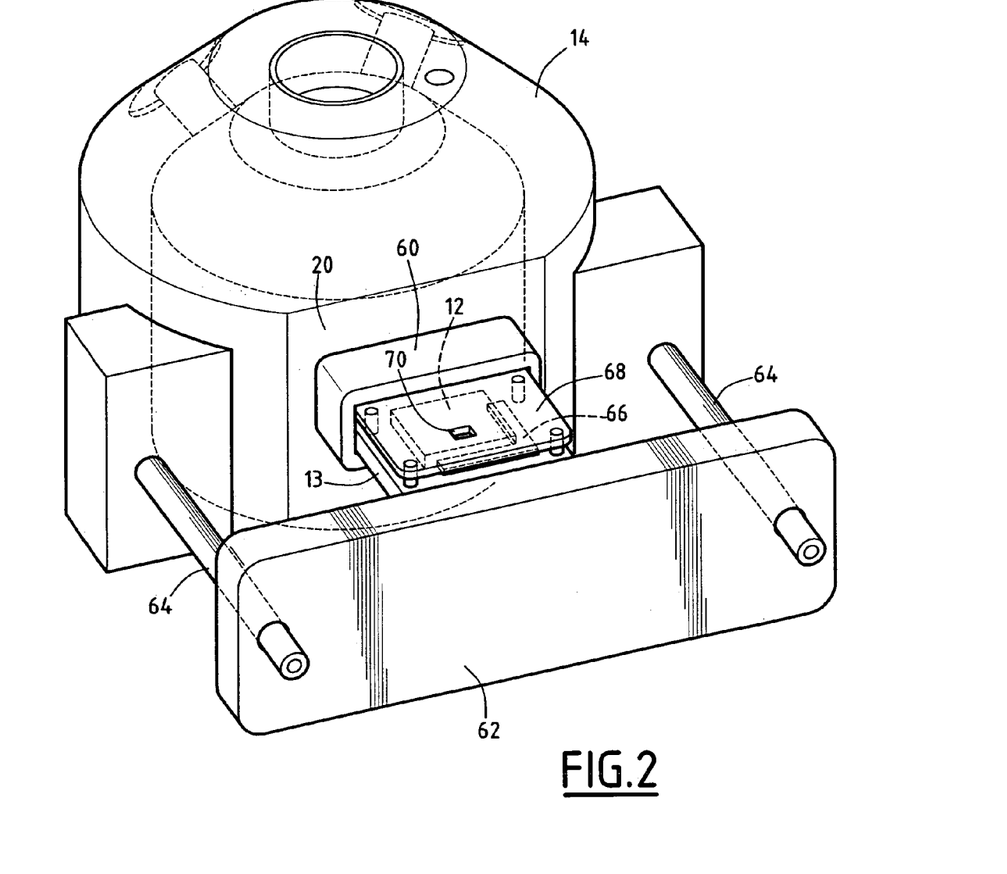
FIG. 2 is a perspective view of the chamber of the installation of FIG. 1.

The chamber 14 has a flat bottom 18, a generally cylindrical lateral wall 20 and a cover 22 which is generally of frustoconical shape underneath a flat upper portion 24. The upper portion 24 has a transparent window 26 which is provided perpendicularly above the central portion of the bottom 18, at which the plate 13 is located in FIG. 1 when it is in a position for processing the circuit.

A laser source 28 is arranged outside the chamber 14 facing the window 26 and is directed towards the test-piece 12. The laser is, for example, a galvano laser, a laser of the Nd:YAG type or an Excimer laser. This laser is connected by a central control unit 30 for control thereof.

The central control unit 30 is formed, for example, by a processor which is associated with input and output cards.

The laser source 28 is carried by means 32 for moving the laser beam in the plane of the circuit 12 in two directions which are mutually perpendicular. Those movement means are connected to the central control unit 30 which is capable of controlling the position of the laser and which allows scanning of the upper surface of the circuit 12 by the laser beam.

The frustoconical wall 22 of the cover is further provided with a transparent window 34, behind which there is provided a monitoring camera 36 which is positioned outside the vessel and which is directed in order to observe the test-piece 12 arranged in the vessel.

The camera 36 is connected to a viewing monitor 38 which allows the development of the exposure of the surface of the integrated circuit to be monitored.

As illustrated in FIG. 1, the optical axis of the camera 36 is angularly displaced relative to the normal relative to the circuit 12.

In this manner, advantageously, a circuit for correcting images is interposed between the camera 36 and the monitor 38. The image correction circuit is capable of implementing an algorithm for processing images allowing rectification of the image of the circuit obtained, which is initially in the form of a trapezium, so that this image is of rectangular shape, as if it had been viewed with an optical axis of the camera perpendicular to the normal relative to the circuit.

In a variant, a mirror or an assembly of mirrors is arranged inside the vessel between the camera 36 and the circuit 12 in order to modify the beam between the camera and the circuit and thereby to ensure, by correction of the angles, rectification of the image.

According to another embodiment, two cameras with different angles are positioned in order to observe the circuit. The images obtained by the two cameras are transmitted to an image processing unit which allows a stereoscopic image of the circuit to be produced.

According to an advantageous embodiment, the three preceding approaches are combined. In this manner, two cameras are, for example, used in order to obtain a stereoscopic image of the circuit whilst a third camera is associated with a set of mirrors or with an image processing unit in order to obtain a rectified rectangular image of the circuit.

A nozzle 40 for injecting a cleaning gas is provided through the frustoconical wall 22. This nozzle is directed towards the integrated circuit 12. The nozzle 40 is supplied from a source 42 of pressurised cleaning gas. The supply of the nozzle 40 from the gas contained in the source 32 is controlled by the central control unit 30 which controls a valve 44.

The gas contained in the source 42 projected by the nozzle 40 is, for example, formed by carbon dioxide which is capable of atomising the materials which are not removed by the plasma.

The vessel further comprises means 46 for producing a plasma at the surface of the integrated circuit 12 to be exposed. Those means 46 comprise a ring 48 for injecting a gas which is capable of being ionised. That ring is provided in accordance with the axis of the chamber inside the chamber beside the window 26. The ring 48 comprises an assembly of perforations which are distributed at the periphery thereof and which are directed towards the circuit 12.

The ring 48 is supplied by an ionisation gas source 50 which is provided outside the chamber, to which the ring is connected via a valve 52 which is controlled by the central control unit 30.

The gas contained in the source 50 is formed, for example, by an admixture of oxygen and carbon tetrafluoride.

The means 46 for producing a plasma further comprise a radiofrequency generator 54 which is connected to the plate 13 for supporting the test-piece. That generator 54 is capable of producing an intense electromagnetic field which is capable of bringing about ionisation of the gas contained in the chamber.

The generator 54 is connected to the central control unit 30 for the control thereof.

Intake openings 56 are provided in the bottom 18 around the test-piece 12. Those openings are connected to a vacuum pump 58 which is controlled by the central control unit 30. The openings 56 are capable of drawing in the gas contained in the chamber and the debris produced during the displacement of the coating under the action of the laser radiation and the plasma.

As illustrated in FIG. 2, the plate for supporting the test-piece 13 is mounted so as to be slidingly movable relative to the chamber 14. The chamber 14 comprises, in its lateral wall 20, an inlet opening 60, through which the plate 13 supporting the test-piece 12 is mounted so as to slide. The plate 13 is fixedly joined to a sliding member 62 which is mounted in a movable manner on two lateral slides 64 which are fixedly joined to the chamber 14. The member 62 is movable between a position for positioning the circuit, in which the plate is substantially outside the chamber 14, and the position for processing the circuit, in which the plate 13 and particularly the test-piece are located perpendicularly below the window 26.

The plate 13 and the member 62 are provided with a sealing joint which allows the sealing of the chamber 16 to be ensured when the plate is in a position for processing the test-piece. The plate comprises an angle 66 for positioning the integrated circuit 12.

Finally, a protection mask 68 is provided above the circuit and is carried by the plate 13. This mask delimits an aperture 70 for the passage of the laser beam and the plasma perpendicularly relative to the portion of the integrated circuit which has to be exposed.

In order to expose an integrated circuit, the circuit is first positioned on the plate 13 below the mask 68, then the plate is introduced into the chamber. For creating vacuum conditions, the pressure is subsequently reduced in the chamber using the pump 58. The surface of the integrated circuit which has to be exposed is subsequently subjected to laser radiation from the source 28 in step 72 of FIG. 3. The laser beam used preferably has a power level between 1 and 50 Watt. It is applied for a period of time, for example, between 5 and 30 seconds. The laser beam is particularly applied in order to allow ablation of the coating of the circuit over the majority of the thickness thereof, leaving only a residual thickness between 50 and 200 μm and preferably 100 μm.

During the processing by the laser beam, the development of the circuit is observed via the camera 36. The debris removed from the coating are received by the openings 56.

Figure 3:
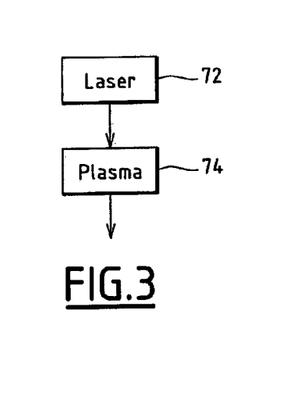
FIG. 3 is a flowchart of the method used for exposing an integrated circuit.

After only the residual polymer coating remains, a plasma is produced near the circuit 12 in step 74, without the circuit having been removed from the vessel 16 and whilst it is still under reduced pressure. This plasma is produced by gas being injected from the ring 48 and a magnetic field being produced by the generator 54.

The plasma preferably has the characteristics suitable for ensuring displacement of the resin present. The temperature, the working pressure level and the type of gases used are selected in accordance with the type and thickness of resin.

It is applied for a period of time between 30 and 240 minutes.

The presence of the plasma allows, owing to the action of the ionised particles, complete removal of the residual polymer layer even in the undercut portions of the circuit and under the copper connections.

During the application of the plasma, periodic atomisations of carbon dioxide allow the residues produced to be eliminated.

According to a construction variant, the first step 72 of using the laser radiation is carried out whilst the integrated circuit is subjected to a plasma.

When it is found to be necessary, for example, owing to the unequal thickness of the residual polymer layer which covers the circuit, the successive application steps 72 and 74 for a laser and a plasma are reiterated in order to allow ablation of the residual layer in the regions in which it is thickest by means of the laser beam, after previous action by the laser and the plasma. After the second application of the laser radiation, a final step of processing by plasma is applied.

According to another embodiment, the plasma produced in the chamber 16 is maintained, not by a magnetic field being produced owing to the generator 54, but instead by being subjected to laser radiation having a suitable power level, that radiation being suitable for ionising the gas in the chamber, but being insufficient in itself to attack the polymer coating.

It will be appreciated that, with such a method, the circuit may be exposed very precisely owing to the final action of the plasma.

The combined use of the laser radiation and the plasma in the same vessel further reduces the operations and therefore allows an exposure method which is very rapid and easy to carry out. The fact of remaining under reduced pressure between the two operations allows the metals which constitute the circuit or the connections of the circuit not to become oxidised with ambient air.

The combined action of the laser at first and the plasma in a second step allows very satisfactory exposure of the connection wires which connect the integrated circuit itself to the lateral connection lugs which protrude relative to the casing. The action of the laser allows the upper surface of those connection wires to be exposed whilst the polymer located below the connection wires is removed by the action of the plasma, without the connection wires becoming damaged.

Such exposure of the connection wires is particularly advantageous for a subsequent step of shear tests of the connection wires, the results obtained during the tensile tests not being modified by the aggressive action used in order to remove the polymer.

Figure 4:
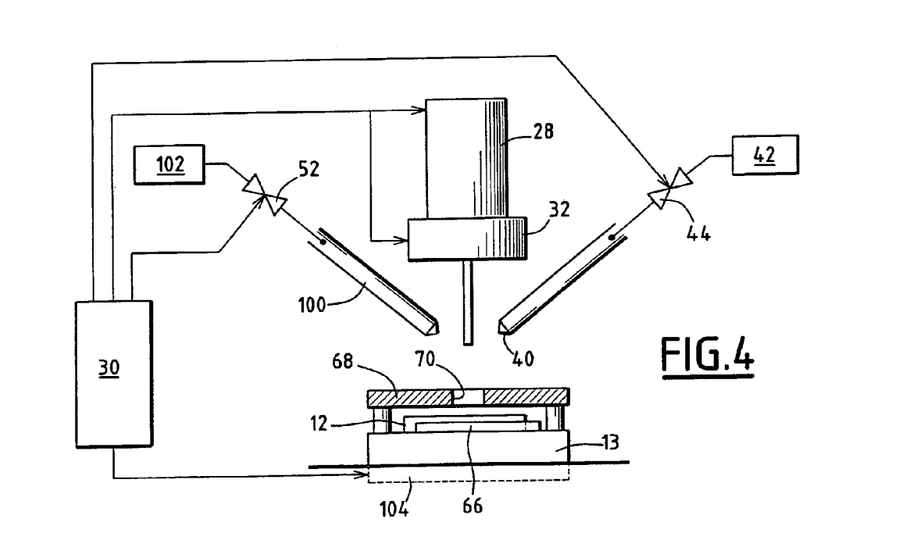
FIG. 4 is a schematic front view of another embodiment for the installation for carrying out the method.

FIG. 4 illustrates another embodiment for exposing an integrated circuit. In this Figure, elements which are identical or correspond to those of FIG. 1 are referred to using the same reference numerals.

In this embodiment, the plasma under reduced pressure namely in vacuum conditions is replaced with atmospheric plasma. In this manner, the chamber 14 is unnecessary. The test-piece 12 which is supported by the plate 13 is, as above, arranged facing the laser source 28 and means 40, 42, 44 for injecting a cleaning gas are provided.

The means for producing an atmospheric laser comprise a nozzle 100 for discharging a plasma gas which is connected to a gas source 102 which contains oxygen or an admixture of oxygen and carbon tetrafluoride. The laser is used as a source for exciting the gas injected in order to bring about ionisation of the plasma gas.

The implementation method in this installation is identical to the one used in the installation of FIG. 1, the circuit 12 being subjected firstly to laser radiation then subjected to an attack by plasma.

Figure 5:
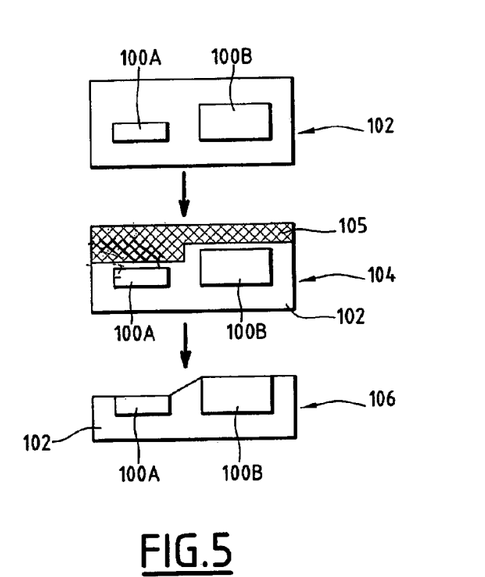
FIG. 5 is a diagram showing the successive steps for processing a test-piece comprising two circuits in the same coating.

FIG. 5 illustrates the successive steps for exposing the surface of two integrated circuits in the same casing formed by polymer.

Currently, it is known to associate a plurality of integrated circuits 100A, 100B in the same polymer 102, thereby allowing the provision of the equivalent of a miniature electronic card. Such circuits are commonly referred to as a "system in package" (SIP) or a "multi-chip module" (MCM). The integrated circuits provided in such a casing may have upper surfaces which are located at different levels, in particular when the integrated circuits have different thicknesses.

According to the invention, the casing is firstly subjected in step 104 to laser radiation which is intended to remove the majority of the thickness of the covering layer. The portion removed is designated 105. This ablation is carried out by a plurality of passes carried out with the laser radiation, the number of passes being greater above the circuit whose upper face is the deepest. In this manner, the laser is applied so as to allow a residual polymer layer 102 having substantially the same thickness to remain behind on each of the circuits.

Subsequently, as illustrated in step 106, the integrated circuits 100A, 100B are subjected to a plasma which brings about the simultaneous ablation of the residual polymer layer which remains above the various circuits.

Whatever the embodiment of the installation, according to one particularly advantageous embodiment of the invention, the protection mask 68 is initially a solid plate which is formed from polymer or metal. The aperture 70 is directly processed by the laser radiation from the laser 28. In this manner, the aperture is positioned very precisely and has a completely satisfactory shape for the processing of the circuit arranged below. Such adjustment is difficult to carry out manually with mechanical positioning of a pre-processed mask.

If, during the processing of the circuit, it appears that other zones of the circuit must be studied and are covered by the protection mask 68, a complementary aperture is further provided in the protection mask 68 by action of the laser radiation from the laser 28 in order to produce another working zone.

Similarly, in a variant, the initial aperture 70 is enlarged by the action of the laser.

The plasma attack carried out during step 74 is reactive ion etching (RIE). The plasma is produced by generating a magnetic field in a gas at a pressure generally of from 10 mTorr to 1000 mTorr. This is a so-called low-pressure plasma.

The magnetic field is produced by the radiofrequency generator 54 which is connected to electrodes which are positioned in the vessel 16 in the environment of the admixture of oxygen and carbon tetrafluoride at low pressure. The magnetic field ionises the molecules of the gas admixture, stripping them of their electrons and thereby creating the plasma.

The integrated circuit 12 absorbs the free electrons which are accelerated by the magnetic field so that it becomes negatively charged. Conversely, the plasma is positively charged owing to its high concentration of positive ions compared with the free electrons. Owing to this important difference of potential, positive ions move towards the circuit 12 where they collide with the residual polymer and the polymer located below the connection conductors to be attacked chemically. The ions react chemically with the residual polymer and eject a portion of the polymer, with their kinetic energy being transferred.

The plasma attack is carried out during or after the application of the laser whilst the integrated circuit 12 is kept on the same support plate and the support plate is not moved.

In a variant, the application of the laser radiation is carried out until the thickness of the residual polymer layer above the integrated circuit is between 200 µm and 0 µm.

The power of the laser used is approximately 0.5 Watt per $cm^2$.

According to one embodiment of the invention, the method for exposing the surface of an integrated circuit is carried out in accordance with the steps described below.

The test-piece is an electronic component which has a size of approximately a few $cm^2$. This component is coated in a polymer-based resin (black plastics material in appearance). This component must be open so as to expose the integrated circuit. During the production of this integrated circuit, the integrated circuit is mounted on a generally metal reinforcement, on which there are arranged the pins (or lugs) of external connections. The connection between the integrated circuit and the pins is brought about by connection conductors which are welded at one side and the other.

The assembly is coated in the polymer-based resin, leaving only the end of the connection pins exposed. In the coating method, the integrated circuit is rarely positioned precisely at the centre and still less so in a plane which is completely parallel with the surface of the coating of the component.

Therefore, the thickness of polymer to be removed is not uniform over this surface in order to expose the surface of the integrated circuit.

In a preferential manner, an X-ray image is made of the component so as to estimate the size of the integrated circuit. By correlating that X-ray image with an image at the scale of the component, obtained with a calibrated optical camera, the position of the integrated circuit can be measured (top view) in order to reposition the application zone of the laser and the plasma relative to the component itself.

In this case, the integrated circuit has dimensions of 200 µm×200 µm.

The electronic component is positioned on a plate in order to be introduced into the device according to the invention.

The aperture serves to protect the external pins of the test-piece. The aperture 70 of the protection mask 68 has dimensions of approximately 1 $mm^2$. In this aperture, the combined application of the laser and the plasma is carried out over a predefined zone of the integrated circuit.

The positional measurement of the application zone is thus aligned with the component positioned on the support plate 13. This positioning can be carried out in various manners, with a metrology system which allows measurement of the dimensions relative to a reference of the plate, or with a calibrated optical camera or a motor-driven laser pointer. Similarly, the depths can be measured with a metrology system (motor-driven sensor) or with an interferometry system, or with a camera which is provided with a calibrated depth system.

For a first component, the thicknesses of resins cannot be measured with precision. Therefore, a zone wider than the circuit is favourably defined, to which the laser and/or the plasma will be applied.

A first laser ablation is started over a zone measuring 220 µm×220 µm so as to cover the zone of the integrated circuit measuring 200 µm×200 µm. After a few minutes, the operation is stopped in order to check the depth of resin removed. The depth is preferably measured in the vessel 16 so as to eliminate any risk of error in repositioning the support plate 13 in the vessel. It is very difficult to reposition a mechanical element to within a few tens of micrometres. Such repositioning would be a risk of error which would detract from the success of opening the component and the necessary steps would excessively extend the total duration of the opening.

The measurement is carried out, for example, with a camera 36, with the focusing being adjusted in order to have a depth measurement.

This measurement allows an increase to the laser ablation speed.

In this example, the resin thickness is 1.5 mm.

There is produced another zone which is slightly smaller at 220 µm×210 µm so as to retain a step M1. The depth of the step M1 will be measured subsequently in order to determine more precisely the laser ablation speed.

Since the position of the electronic component has been retained, the laser ablation is started directly without realigning the plate. The ablation time is calculated so as to leave 700 µm of resin.

Again, the operation is stopped and a measurement is carried out so as to better calibrate the etching speed and a step M2 is left.

At that time, still without the electronic component being removed from the vessel 16, plasma etching is begun. With a reactive ion etching (RIE) type physico-chemical plasma, the typical etching speed is 27 µm/h. Therefore, a first pass is carried out in a zone measuring 210 µm×210 µm in order to calibrate the etching speed of the resin with a step M3.

The laser ablation is started again so as to leave, for example, 200 µm of resin, over a smaller zone measuring 200 µm×210 µm.

When the operation is stopped, it is apparent that an edge of the circuit is already visible. The laser ablation has continued slightly further than expected. In this example, the explanation involves the inclined position (vertically) of the circuit.

It is therefore decided to again produce an ablation zone in order to expose the remainder of the circuit. The ablation zone is of triangular shape, passing via the three corners which are not yet exposed.

In terms of depth, a gradient is selected so as to have a greater depth in a corner diametrically opposed to the corner which is exposed.

The ablation is restarted at that new triangular zone in order to remove 20 µm at the deepest, which is deducted from our estimate of the gradient of the inclination in question.

Subsequently, the plasma step is begun, over a zone which is slightly wider in order to move closer to the circuit and the remainder of the circuit is exposed.

If necessary, laser ablation is again used. This can in turn be followed by plasma ablation until the circuit is completely exposed.

For opening a second component of the same type, the etching speeds can be calibrated by the fine measurement of the steps M1, M2 and M3, for example. Similarly, the precise depth between the surface of the coating and the integrated circuit is measured at the first circuit and is used as a reference for the following circuits.

The ablation can be started so as to leave approximately 200 µm over the entire surface of the circuit. In accordance with the confidence held in relation to the variability of the position of the circuit from one component to the next, however, it is possible, for example, to allow a margin (250 µm in place of 200 µm) or, conversely, to aim for a lower value (50 µm in place of 200 µm) so as to operate more quickly for the plasma.

The plasmas used are etching plasmas. Preferably, a plasma of the RIE type (reactive ion etching) between those two plasmas is used. However, an inductive ICP type plasma (inductively coupled plasma) would achieve very good performance levels. The difference between those two plasmas is between the preparation of the plasma which is carried out in an external chamber. The plasma is subsequently transferred by a tube to the chamber in which the test-piece is located, the distance separating the two chambers typically being 10 cm.

In all cases, the etching plasmas may have an etching speed of less than 120 µm per hour. Typically, when an RIE type plasma is used, the speed is 27 µm per hour.

The invention claimed is:

1. A method for exposing an integrated circuit by ablation of a polymer coating which initially covers the integrated circuit, comprising:
a combined application of laser radiation and a plasma to the polymer coating which initially covers the integrated circuit to expose the integrated circuit for testing, the combined application being carried out in a same vessel (16), wherein a power of a laser used for the laser radiation is approximately 0.5 Watts per cm$^2$; and
observing the integrated circuit with a monitoring camera positioned at a transparent window of the vessel.

2. The method according to claim 1, further comprising: firstly, a step (72) of applying laser radiation and then a step (74) of applying a plasma.

3. The method according to claim 1, wherein the step (74) of applying the plasma is started while the integrated circuit is still subjected to laser radiation.

4. The method according to claim 1, wherein the application (72) of the laser radiation is carried out until the thickness of the residual polymer coating above the integrated circuit is between 50 and 200 µm.

5. The method according to claim 1, wherein the method comprises two successive processing steps, firstly, by application of laser radiation and then by application of a plasma.

6. The method according to claim 1, wherein the application (72) of the laser radiation is carried out while the integrated circuit is subjected to the application of a plasma.

7. The method according to claim 1, further comprising: a step of atomising a gas flow towards the surface of the integrated circuit capable of disengaging residual particles which are present on the integrated circuit.

8. The method according to claim 1, wherein the plasma is a reduced pressure plasma.

9. The method according to claim 1, wherein the plasma is an atmospheric plasma.

10. The method according to claim 1, wherein the plasma contains oxygen and carbon tetrafluoride.

11. The method according to claim 1, wherein the method further comprises a preceding step of reducing a pressure of the vessel (16) to create a vacuum, and in that the vessel (16) remains under reduced pressure during the combined application of the laser radiation and the plasma.

12. A shear test method for the connection conductors of an integrated circuit which is initially covered by a polymer coating comprising:
an initial step (72, 74) of exposing the integrated circuit and the connection conductors by a method according to claim 1; and
a shear test step for the conductors which are exposed in this manner.

13. The test method according to claim 12, wherein the application of the plasma is capable of removing the residual polymer and the polymer located on the connection conductors.

14. An installation for exposing an integrated circuit by ablation of a polymer coating which initially covers the integrated circuit, comprising:
means (28) for applying laser radiation to a surface of the integrated circuit, wherein a power of a laser used for the laser radiation is approximately 0.5 Watts per cm$^2$;
means for applying, combined with the application of laser radiation, an attack by plasma to the polymer coating which initially covers the integrated circuit to expose the integrated circuit for testing;
a plate (13) for supporting the integrated circuit during the processing thereof, the means (28) for applying the laser radiation and the means (46) for applying the plasma being capable of acting on the same support plate (13); and
a vessel having a flat bottom at which the plate is located, and a monitoring camera that is outside the vessel at a transparent window of the vessel and arranged to observe the integrated circuit in the vessel through the window.

15. The installation according to claim 14, wherein the camera has an optical axis angularly displaced relative to a normal relative to the integrated circuit.

16. The method according to claim 1, wherein the application of the laser radiation is carried out while the integrated circuit is subjected to the application of the plasma.

* * * * *

UNITED STATES PATENT AND TRADEMARK OFFICE
CERTIFICATE OF CORRECTION

PATENT NO.       : 8,555,728 B2                                    Page 1 of 1
APPLICATION NO.  : 12/521444
DATED            : October 15, 2013
INVENTOR(S)      : Desplats et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 972 days.

Signed and Sealed this

Fifteenth Day of September, 2015

Michelle K. Lee
*Director of the United States Patent and Trademark Office*